United States Patent
Park

(10) Patent No.: US 9,159,377 B2
(45) Date of Patent: Oct. 13, 2015

(54) RESISTIVE MEMORY APPARATUS, OPERATING METHOD THEREOF, AND SYSTEM HAVING THE SAME

(71) Applicant: SK hynix Inc., Gyeonggi-do (KR)

(72) Inventor: Hae Chan Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 26 days.

(21) Appl. No.: 14/142,363

(22) Filed: Dec. 27, 2013

(65) Prior Publication Data
US 2015/0098264 A1 Apr. 9, 2015

(30) Foreign Application Priority Data
Oct. 7, 2013 (KR) .......................... 10-2013-0119336

(51) Int. Cl.
*G11C 11/00* (2006.01)
*G11C 7/00* (2006.01)
*G11C 5/14* (2006.01)
*G11C 13/00* (2006.01)

(52) U.S. Cl.
CPC ............ *G11C 5/145* (2013.01); *G11C 13/0002* (2013.01); *G11C 13/0033* (2013.01); *G11C 13/0038* (2013.01); *G11C 13/0069* (2013.01)

(58) Field of Classification Search
CPC ...... G11C 7/16; G11C 5/145; G11C 13/0002; G11C 13/0033; G11C 13/0069
USPC .......................................... 365/192, 148, 222
See application file for complete search history.

(56) References Cited

U.S. PATENT DOCUMENTS

| 7,605,700 | B2* | 10/2009 | Drago et al. ................ 340/572.1 |
| 7,966,447 | B2* | 6/2011 | Atkinson ....................... 711/106 |
| 8,633,822 | B2* | 1/2014 | Cunningham et al. ...... 340/572.1 |
| 2010/0058018 | A1* | 3/2010 | Kund et al. ..................... 711/167 |
| 2012/0099364 | A1* | 4/2012 | Park et al. ...................... 365/148 |
| 2014/0141760 | A1* | 5/2014 | Ganesh et al. ................. 455/418 |

FOREIGN PATENT DOCUMENTS

| JP | 2009-217701 | 9/2009 |
| KR | 1020050096386 | 10/2005 |

OTHER PUBLICATIONS

Devi et al., Design of an RF-DC conversion circuit for energy harvesting, 2012 IEEE International Conference on Electronics Design, Systems and Applications (ICEDSA), Nov. 2012.*

* cited by examiner

*Primary Examiner* — Viet Q Nguyen
(74) *Attorney, Agent, or Firm* — IP & T Group LLP

(57) ABSTRACT

A resistive memory apparatus includes a memory unit including a resistive memory cell array, a voltage generation unit suitable for receiving a radio frequency (RF) signal, and converting the RF signal into a direct current (DC) voltage, and a control unit suitable for controlling a refresh operation to be performed on the resistive memory cell array, wherein the boosted DC voltage is used as an operation voltage for the refresh operation.

22 Claims, 7 Drawing Sheets

RESISTIVE MEMORY APPARATUS, OPERATING METHOD THEREOF, AND SYSTEM HAVING THE SAME

CROSS-REFERENCES TO RELATED APPLICATION

This application claims priority under 35 U.S.C. 119(a) to Korean application No. 10-2013-0119336, filed on Oct. 7, 2013, in the Korean intellectual property Office, which is incorporated herein by reference in its entirety.

BACKGROUND

1. Technical Field

Various embodiments of the inventive concept relate to a semiconductor integrated circuit, and more particularly, to a resistive memory apparatus, an operating method thereof, and a system having the same.

2. Related Art

Semiconductor memory apparatuses are largely divided into volatile memory apparatuses and non-volatile memory apparatus.

Typical examples of the volatile memory apparatuses may be dynamic random access memories (DRAMs). The DRAM periodically refreshes a state of a cell capacitor constituting a unit memory cell to retain stored data. The DRAM may perform a read/write operation at high speed, but the DRAM has high power consumption.

Meanwhile, a non-volatile memory apparatus may include a flash memory apparatus and a resistive memory apparatus. The flash memory apparatus has a non-volatile property to retain data even in power off, but the flash memory apparatus have short lifespan with the limitation of the number of times of programming.

The resistive memory apparatus has advantages of the DRAM and the flash memory apparatus.

Typical examples of resistive memory devices are a phase-change random access memory (PCRAM) using a chalcogenide compound, a ferroelectric RAM (FRAM) using a ferroelectric capacitor, a resistive RAM (ReRAM) using metal oxide, and a magnetoresistive RAM (MRAM) using perovskite.

Among the resistive memory apparatuses, the PCRAM may determine data to be stored in the selected memory cell based on a crystalline state of a phase-change material. By heating the phase-change material, a phase of the phase-change material may be changed, and thus the resistance state may be controlled. The PCRAM has a unit memory cell including an access device and the phase-change material as a resistive device for storing data. Resistance of the phase-change material may increase due to various causes, and such phenomenon is called resistance drift. The resistance drift may be intensified, as a resistance of the phase-change material becomes high.

FIG. 1 is a view for explaining a fail due to the resistance drift.

A memory cell that may store two bits or more in one memory cell is called a multilevel cell (MLC). FIG. 1 illustrates change in resistance of a multilevel cell that stores data of four levels R1, R2, R3, and R4 as time passes.

As the memory cell has a high-resistance state (i.e., in order of R4>R3>R3 >R1), the resistance drift is serious. A fail may occur from a point in time 'A' when a resistance of the memory cell programmed to have a resistance of R3 exceeds a reference resistance Ref.

In other words, a time denoted by 'A' is referred to as a data retention time (or a drift retention time) of the memory cell.

A method for preventing a fail due to the resistance drift are in demand.

SUMMARY

According to an embodiment, a resistive memory apparatus may include a memory unit including a resistive memory cell array, a voltage generation unit suitable for receiving a radio frequency (RF) signal and converting the RF signal into a direct current (DC) voltage, and a control unit suitable for controlling a refresh operation to be performed on the resistive memory cell array, wherein the boosted DC voltage is used as an operation voltage for the refresh operation.

According to an embodiment, an operating method of a resistive memory apparatus may include receiving a radio frequency (RF) signal, and performing a refresh operation on memory cells included the resistive memory apparatus based on the RF signal.

According to an embodiment, an electronic system may include a processor suitable for performing decoding on a command input from an external apparatus, and a resistive memory apparatus including a memory unit including a memory cell array accessed by the processor, a voltage generation unit suitable for receiving a radio frequency (RF) signal, and a control unit suitable for controlling a refresh operation on the memory cell array in response to a refresh command generated based on the RF signal.

According to an embodiment, an electronic system may include a resistive memory apparatus suitable for receiving a radio frequency (RF) signal, and performing a refresh operation on memory cells included the resistive memory apparatus based on the RF signal, a memory controller suitable for controlling an operation of the memory apparatus, and a card interface suitable for performing data exchange between a host and the memory controller.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
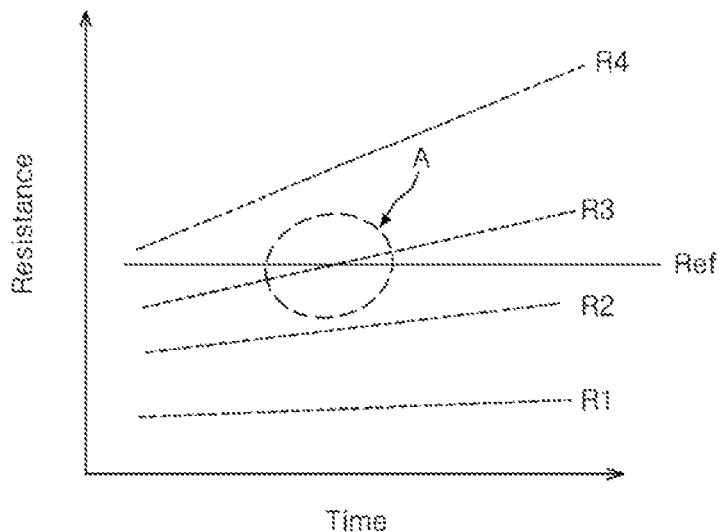
FIG. 1 is a graph for explaining a fail due to resistance drift.

Hereinafter, exemplary embodiments will be described in detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and embodiments of the present invention. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Although a few embodiments of the inventive concept will be shown and described, it will be appreciated by those of ordinary skill in the art that changes may be made in these exemplary embodiments without departing from the principles and spirit of the inventive concept.

Figure 2:
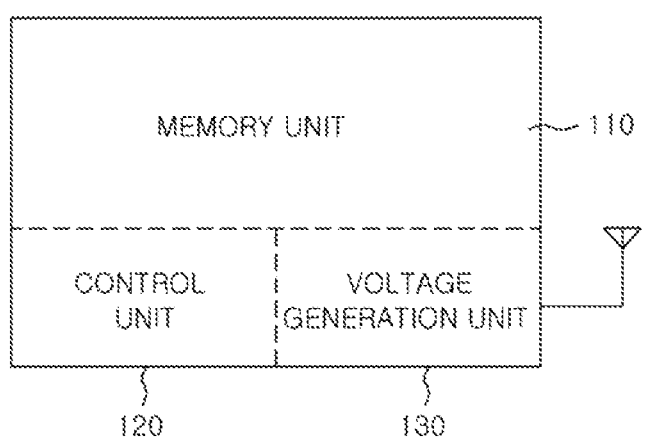
FIG. 2 is a view illustrating a resistive memory apparatus according to an embodiment of the inventive concept.

FIG. 2 is a view illustrating a resistive memory apparatus 10 according to an embodiment of the inventive concept.

As illustrated in FIG. 2, the resistive memory apparatus 10 may include a memory unit 110 formed in a first area of a semiconductor substrate, a control unit 120 formed in a second area of the semiconductor substrate, and a voltage generation unit 130 formed in a third area of the semiconductor substrate. The memory unit 110, the control unit 120, and the voltage generation unit 130 may be integrated in a single chip (or one-chip).

The memory unit 110 may include a memory cell array (i.e., a resistive memory cell array), an address decoder, an input/output circuit block, and the like. Here, memory cells, each included in the memory cell array, may include an access device and a resistive device (e.g., a phase-change material).

The voltage generation unit 130 receives a radio frequency (RF) signal. In a case where a refresh command provided as the RF signal, the voltage generation unit 130 may transmit the refresh command to the control unit 120.

The control unit 120 may control an overall operation of the resistive memory apparatus 10. In particular, the control unit 120 may receive the refresh command from the voltage generation unit 130, and perform a refresh operation on the memory cell array in the memory unit 110.

Further, the voltage generation unit 130 generates an operation voltage in response to the refresh command provided as the RF signal. The operation voltage may be provided as a refresh voltage to the memory cell array when the refresh command is performed under the control of the control unit 120.

Although not shown, the resistive memory apparatus 10 may further include a main power supply unit (not illustrated). When the resistive memory apparatus 10 includes the main power supply unit, the voltage generation unit 130 may provide the refresh command received as the RF signal to the control unit 120, and may allow the refresh operation to be performed by using a voltage provided from the main power supply unit.

When the main power supply unit is not included in the semiconductor memory apparatus 10, the voltage generation unit 130 may generate an operation voltage in response to the refresh command, and may allow the refresh operation to be performed by using the operation voltage. Even when the resistive memory apparatus 10 includes the main power supply unit, the refresh operation may be performed by using the operation voltage generated not in the main power supply unit but in the voltage generation unit 130.

Figure 3:
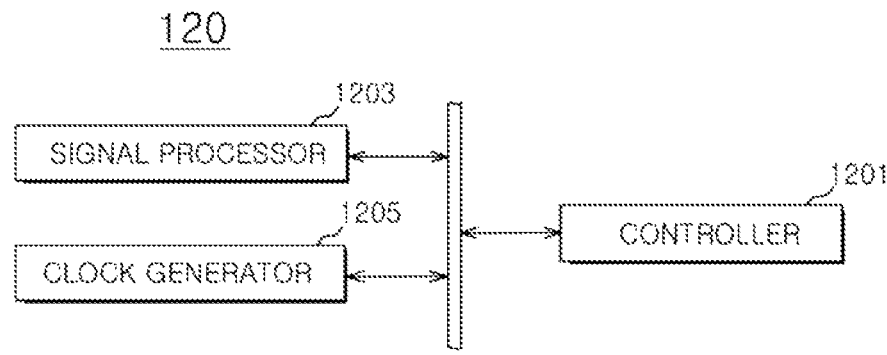
FIG. 3 is a detailed view of a control unit shown in FIG. 2.

FIG. 3 is a detailed view of the control unit 120 shown in FIG. 2.

Referring to FIG. 3, the control unit 120 may include a controller 1201, a signal processor 1203, and a clock generator 1205.

The controller 1201 may allow a programming operation, a read operation, and a refresh operation on the memory cell array in the memory unit 110 to be performed in response to a program command, a read command, and a refresh command, respectively.

The signal processor 1203 decodes the RF signal provided from the voltage generation unit 130 to generate the refresh command, and provides the refresh command to the controller 1201.

The clock generator 1205 enables or disables the controller 1201 based on the refresh command provided from the signal processor 1203. The clock generator 1205 generates a refresh clock signal for the refresh operation having a preset cycle.

Therefore, when the controller 1201 is enabled based on the refresh command decoded in the signal processor 1203, and the refresh clock signal is generated in the clock generator 1205, a refresh operation accompanying a refresh read operation and a refresh write operation on the memory cell array are repeatedly performed by the number of predetermined times. When the controller 1201 is disabled based on the refresh command decoded in the signal processor 1203, the refresh operation is completed.

Figure 4:
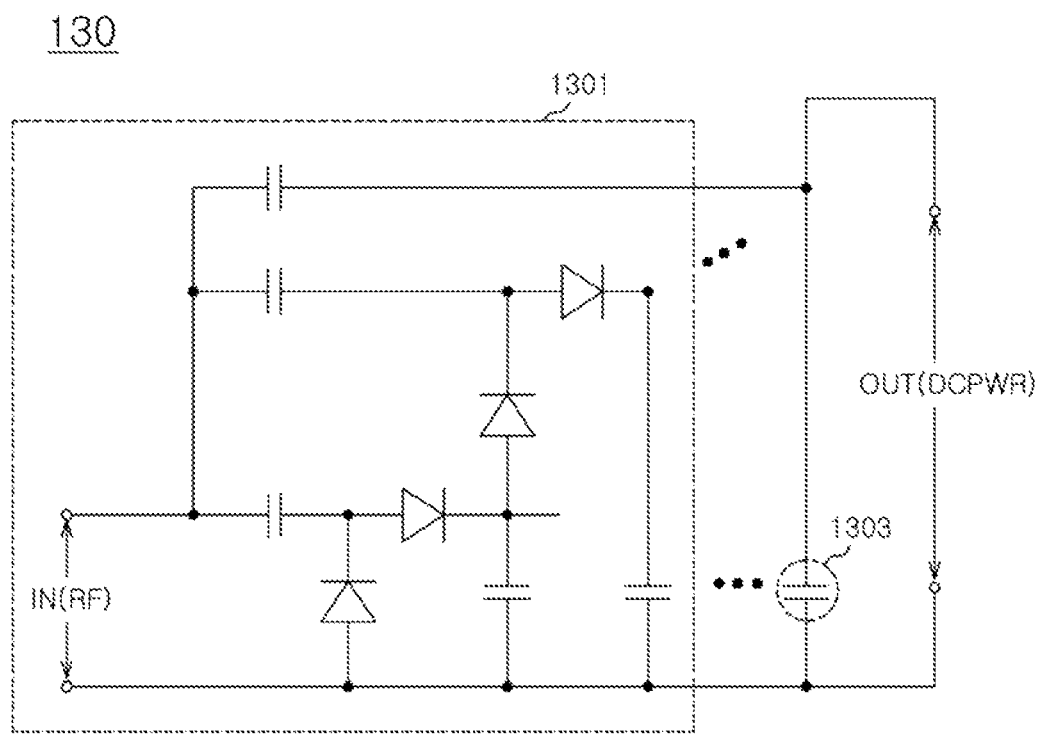
FIG. 4 is a detailed view of a voltage generation unit shown in FIG. 2.

FIG. 4 is a detailed view of the voltage generation unit 130 shown in FIG. 2.

Figure 5:
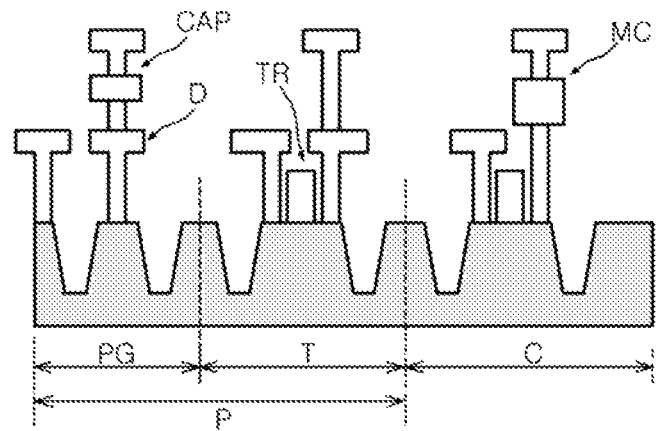
FIG. 5 is a cross-sectional view for explaining the resistive memory apparatus shown in FIG. 2, which is integrated in one-chip.

Referring to FIG. 5, the voltage generation unit 130 may include a voltage multiplier 1301 that may receive the RF signal and generate a direct current (DC) voltage multiplied (or boosted) to a predetermined level, and a charger 1303 that may store the multiplied voltage in the voltage multiplier 1301. An output voltage DCPWR generated in an out terminal OUT of the charger 1303 may be provided to the memory unit 110 or the main power supply unit.

The voltage multiplier 1301 may serve as an RF-to-DC converter that may receive the RF signal from an input terminal IN and covert the RF signal into the DC voltage. When the RF signal is applied to the input terminal IN, the voltage is multiplied through rectification of diodes and voltage boost of capacitors, and a voltage level may be controlled depending on the number of connection stages of the diode and capacitor.

The DC voltage boosted in the voltage multiplier 1301 is stored in the charger 1303 including a storage capacitor, and the output voltage PWR of the charger 1303 may be used as operation power of a digital circuit unit constituting the memory unit 110 or the control unit 120.

When the other voltages having different levels other than the output voltage PWR by the voltage multiplier 1301 and the charger 1303 are used, a voltage may be extracted at a middle stage of the voltage multiplier 1301. Therefore, when the number of stages in the voltage multiplier 1301 is N, N DC voltages having different levels may be generated.

The RF signal may be transmitted from a base station or a repeater of a mobile communication system. In another embodiment, the RF signal may be transmitted from a core network of a wireless data communication system or a repeater or access point of a wireless data communication system. The method of transmitting the RF signal including the refresh command is not limited thereto, and a short-range wireless communication network such as Zigbee®, near field communication (NFC) or Bluetooth® may be used.

When the one-chip resistive memory apparatus is implemented as illustrated in FIG. 1, the voltage generation unit 130 may be simultaneously formed when the memory cell array and a peripheral circuit unit of the memory unit 110 are formed.

FIG. 5 is a cross-sectional view for explaining the resistive memory apparatus shown in FIG. 2, which is integrated in one-chip.

Referring to FIG. 5, a memory cell, a peripheral circuit, and a voltage generation unit are formed on a semiconductor substrate in which a cell area C and a peripheral circuit area P are defined.

The memory unit 110 is formed on the cell area C and the peripheral circuit area P. The peripheral circuit area P is divided into a digital circuit area T and an analog circuit area PG. A memory cell MC is formed on the cell area C. A digital circuit for the peripheral circuit such as a transistor TR is formed in the digital circuit area T. The voltage generation unit including a diode D and a capacitor CAP may be formed in the analog circuit area PG.

When the memory unit 110 is formed on the semiconductor substrate, the voltage generation unit 130 may be simultaneously formed so that the process may be simplified and a chip size may be miniaturized.

Figure 6:
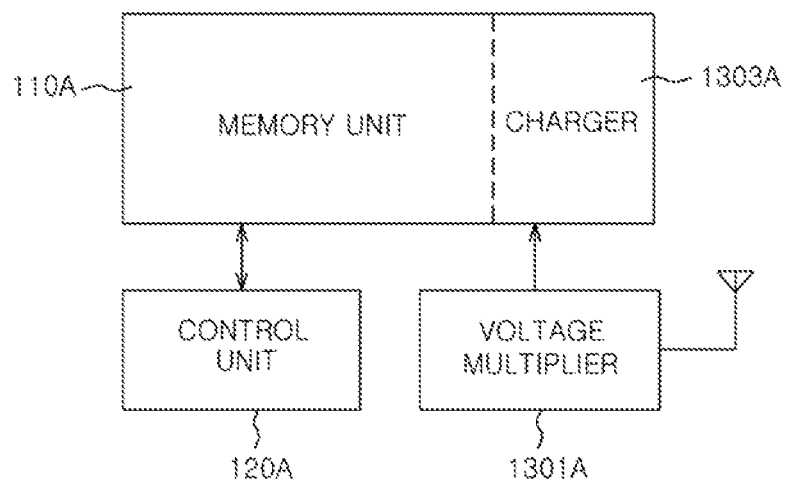
FIGS. 6 to 8 are views illustrating resistive memory apparatuses according to other embodiments of the inventive concept.
Figure 7:
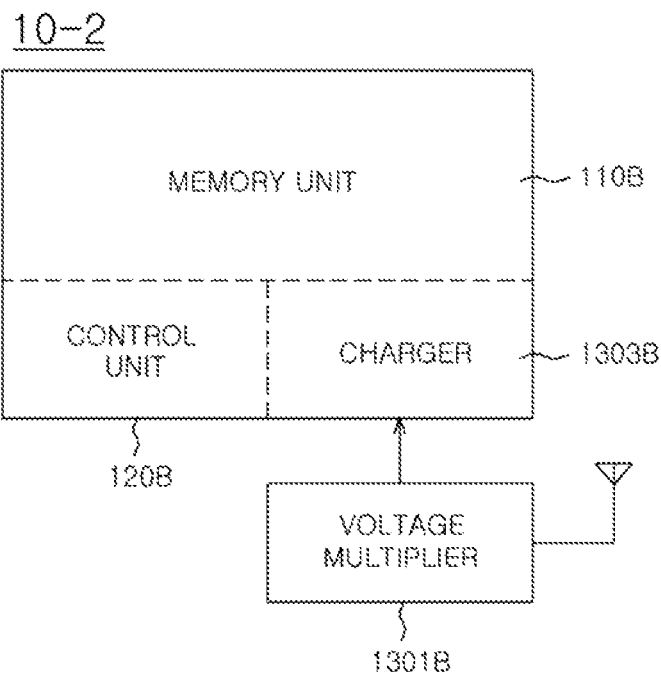
Figure 8:
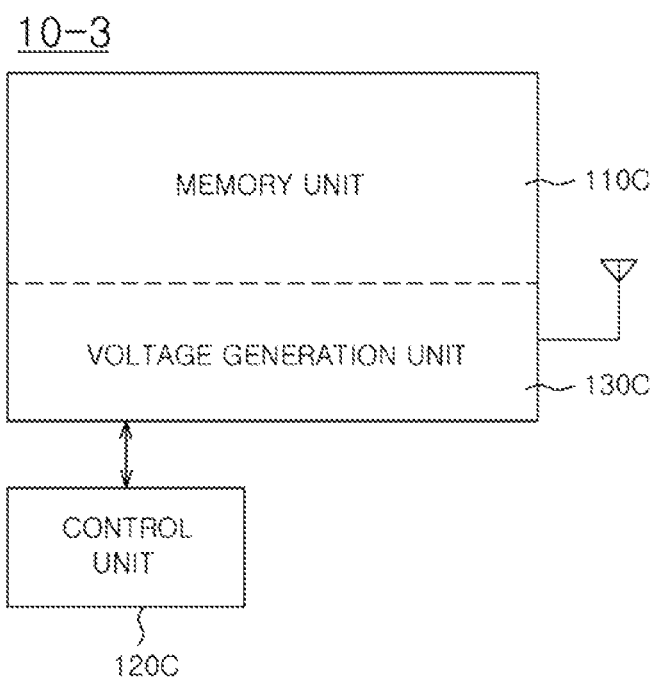

FIGS. 6 to 8 are views illustrating resistive memory apparatuses according to other embodiments of the inventive concept.

In a resistive memory apparatus 10-1 as illustrated in FIG. 6, a memory unit 110A and a charger 1303A are formed as a single chip. A control unit 120A and a voltage multiplier 1301A may be formed in a chip separate from a first chip in which the memory unit 110A and the charger 1303A are formed. At this time, the control unit 120A and the voltage multiplier 1301A may be formed in the same chip or in respective chips.

In a resistive memory apparatus 10-2 as illustrated in FIG. 7, a memory unit 110B, a control unit 120B, and a charger 1303B are formed as a single chip. A voltage multiplier 1301B may be formed in a separate chip.

In a resistive memory apparatus 10-3 as illustrated in FIG. 8, a memory unit 110C and a voltage generation unit 130C are formed as a single chip. The control unit 120C may be formed in a separate chip.

For example, the control units 120A, 120B, and 120C Illustrated in FIGS. 6 to 8 may be configured of the control unit 120 as Illustrated in FIG. 3. The voltage generation unit 130C, and the voltage multipliers 1301A and 1301B and the chargers 1303A and 1303B constituting the voltage generation unit may be configured of the voltage generation unit 130 as illustrated in FIG. 4.

Figure 9A:
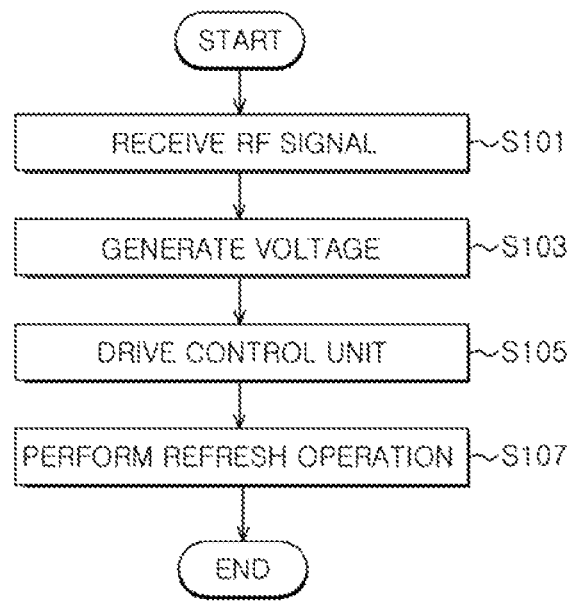
FIGS. 9A and 9B are flowcharts for explaining refreshing methods according to an embodiment of the inventive concept.
Figure 9B:
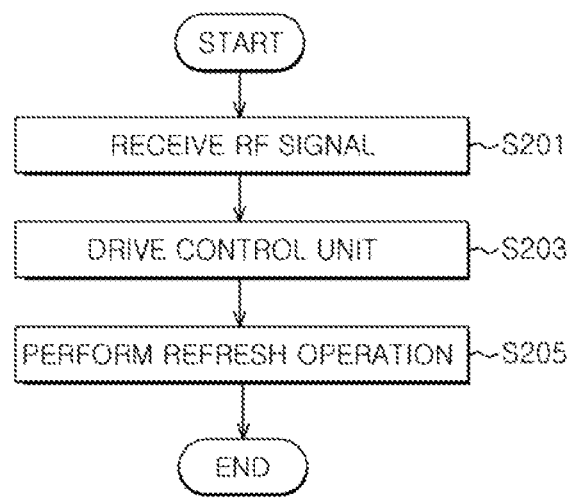
Figure 10:
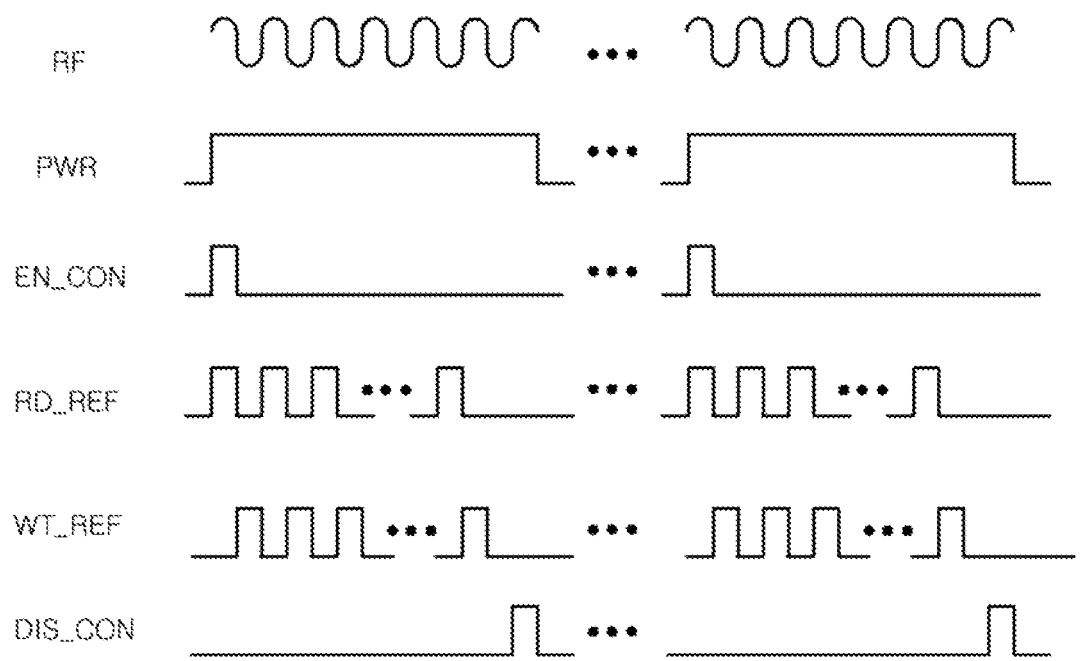
FIG. 10 is a timing diagram for explaining the refresh methods shown in FIGS. 9A and 9B.

FIGS. 9A and 9B are flowcharts for explaining refresh methods according to other embodiments of the inventive concept, and FIG. 10 is a timing diagram for explaining the refresh methods shown in FIGS. 9A and 9B.

An RF signal RF is received in the input terminal IN of the voltage generation unit 130 at step S101, and an output voltage PWR Is applied to the output terminal OUT by an RF-to-DC conversion operation of the voltage generation unit 130 at step S103.

The signal processor 1203 of the control unit 120 provides a refresh command, to which the RF signal applied to the input terminal IN is decoded, to the clock generator 1205 and the controller 1201. Therefore, the controller is enabled by a controller enable signal EN_CON generated in the clock generator 1205 at step S105, and the refresh operation is performed by control of the controller 1201 at step S107.

For the refresh operation, the controller 1201 controls the clock generator 1205 to generate a refresh clock signal, and the controller 1201 repeatedly performs a refresh read operation and a refresh write operation in response to the refresh clock signal. The refresh read operation and the refresh write operation may be performed by the output voltage PWR provided from the voltage generation unit 130.

When a controller disable signal DIS_CON is generated by the clock generator 1205, the refresh operation is terminated.

The refreshing method described in FIG. 9A may be applied to either when the resistive memory apparatus receives power from the main power supply unit or when the resistive memory apparatus does not receive the power from the main power supply unit.

For reference, 'RD_REF' in FIG. 10 denotes a read pulse corresponding to the refresh read operation, and 'WT_REF' in FIG. 10 denotes a write pulse corresponding to the refresh write operation.

FIG. 9B is a flowchart illustrating a refreshing method according to another embodiment of the inventive concept, and may be applied when the resistive memory apparatus receives power from the main power supply unit.

To perform the refresh operation, the input terminal IN of the voltage generation unit 130 may be mutually connected to the control unit 120, specifically, to the signal processor 1203.

When an RF signal is received in the input terminal IN of the voltage generation unit 130 at step S201, the signal processor 1203 connected to the input terminal IN provides a refresh command, to which the RF signal RF applied to the input terminal IN is decoded, to the clock generator 1205 and the controller 1201. Therefore, a controller is enabled by a controller enable signal EN_CON generated in the clock generator 1205 at step S203, and a refresh operation is performed by control of the controller 1201 at step S205.

For the refresh operation, the controller 1201 controls the clock generator 1205 to generate a refresh clock signal, and the controller 1201 repeatedly performs a refresh_read operation RD_REF and a refresh_write operation WT_REF the number of predetermined times in response to the refresh clock signal. The refresh operation may be performed by a voltage provided from the main power supply unit.

When the controller disable signal DIS_CON is generated by the clock generator 1205, the refresh operation is terminated.

Figure 11:
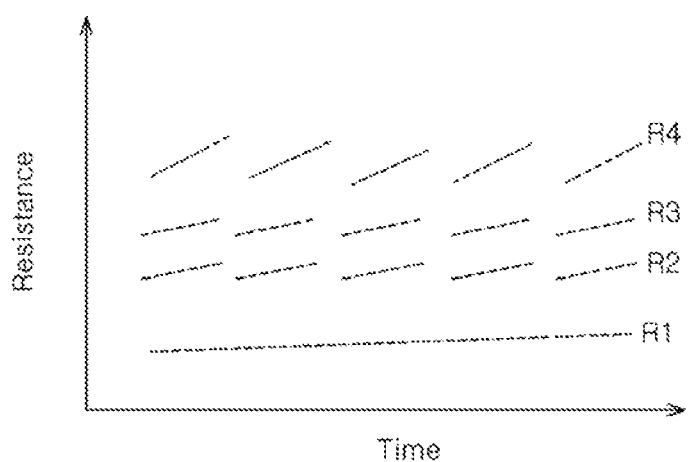
FIG. 11 is a graph for explaining resistance drift resistive memory apparatus according to the embodiments of the inventive concept.

FIG. 11 is a graph for explaining resistance drift improved according to the embodiments of the inventive concept.

In the embodiment of the inventive concept, the RF signal including the refresh command may be transmitted in a preset cycle, or in an arbitrary cycle.

As the memory cell array of the resistive memory apparatus is periodically refreshed according to the refresh command received as the RF signal, resistance states R1, R2, R3, and R4 of a memory cell may be maintained to desired levels.

Therefore, a data retention time may also be increased and a sensing margin may be improved.

Figure 12:
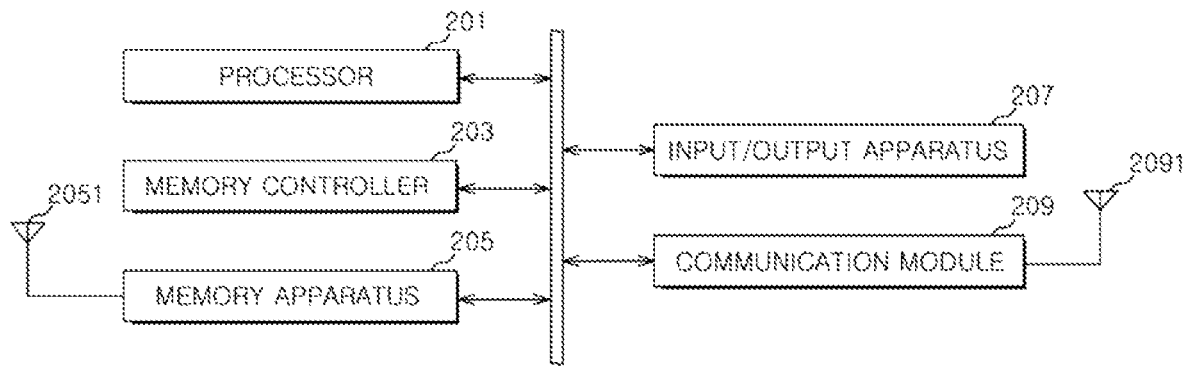
FIGS. 12 and 13 are views illustrating electronic systems according to an embodiment of the inventive concept.
Figure 13:
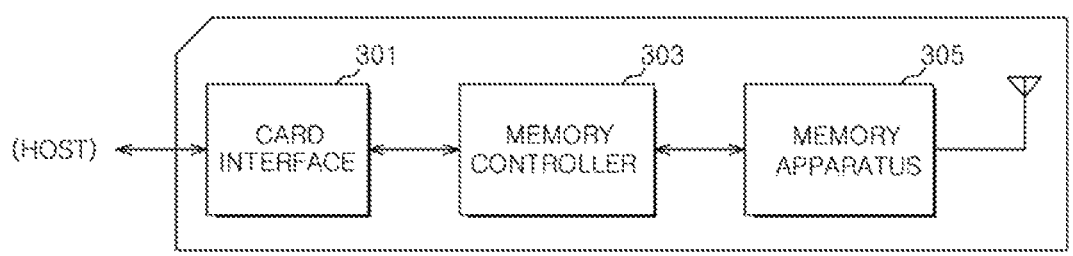

FIGS. 12 and 13 are views illustrating electronic systems according to an embodiment of the inventive concept.

Referring to FIG. 12, an electronic system 20 may include a processor 201, a memory controller 203, a memory apparatus 205, an input/output apparatus 207, and a communication module 209.

The memory controller 203 may control a data processing operation, for example, a programming operation, a read operation, a refresh operation, or the like of the memory apparatus 205 according to control of the processor 201.

Data programmed in the memory apparatus 205 may be output through the input/output apparatus 207 according to control of the processor 201 and the memory controller 205. To this end, the input/output apparatus 207 may include a display apparatus, a speaker apparatus, or the like.

The input/output apparatus 207 may further include an input apparatus, and the input/output apparatus 207 may input a control signal for control of an operation of the processor 201 or data to be processed by the processor 201 through the input apparatus.

In another embodiment, the memory controller 203 may be implemented with a portion of the processor 201 or may be implemented as a separate chipset from the processor 201.

The memory apparatus 205 may be, for example, any one of the resistive memory apparatuses illustrated in FIGS. 2, 6, 7, and 8. That is, the memory apparatus 205 may include the voltage generation unit 130 that may receive the RF signal, and the control unit 120 that may control the refresh operation on the memory cell array according to the refresh command decoded from the RF signal. The voltage generation unit 130 may further generate a refresh voltage according to the refresh command.

The communication module 209 provides a communication environment in which the electronic system 20 is connected to a wired or wireless communication network and exchanges data and a control signal with the wired or wireless communication network.

When the electronic system 20 includes the communication module 209, the electronic system 20 of FIG. 12 may be a portable communication apparatus such as a wireless communication terminal. An antenna 2091 for the communication module 209 may be formed in one body with an antenna 2051 for the voltage generation unit of the memory apparatus 205 or may be formed separately from the antenna 2051 for the voltage generation unit of the memory apparatus 205.

An electronic system 30 illustrated in FIG. 13 may include a card interface 301, a memory controller 303, and a memory apparatus 305.

The electronic system 30 illustrated in FIG. 13 is an exemplary embodiment of a memory card or a smart card. The electronic system 30 may be any one among a personal computer memory card international association (PC) card, a multimedia card, an embedded multimedia card, a secure digital card, and a universal serial bus (USB) drive.

The card interface 301 may perform interfacing between a host and the memory controller 303 according to a protocol of the host. In an embodiment, the card interface 301 may mean hardware that may support a protocol used in the host, software installed in the hardware that may support the protocol used in the host, or signal transmission method.

The memory controller 303 controls data exchange between the memory apparatus 305 and the card interface 301.

The memory apparatus 305 may be, for example, any one of the resistive memory apparatuses illustrated in FIGS. 2, 6, 7, and 8. That is, the memory apparatus 205 may include the voltage generation unit 130 that may receive the RF signal, and the control unit 120 that may control the refresh operation on the memory cell array according to the refresh command decoded from the RF signal. The voltage generation unit 130 may further generate a refresh voltage according to the refresh command.

The above embodiment of the present invention is illustrative and not limitative. Various alternatives and equivalents are possible. The invention is not limited by the embodiment described herein. Nor is the invention limited to any specific type of semiconductor apparatus. Other additions, subtractions, or modifications are obvious in view of the present disclosure and are intended to fall within the scope of the appended claims.

What is claimed is:

1. A resistive memory apparatus, comprising:
   a memory unit including a resistive memory cell array;
   a voltage generation unit suitable for receiving a radio frequency (RF) signal, and converting the RF signal into a direct current (DC) voltage, wherein a refresh command is provided as the RF signal; and
   a control unit suitable for controlling a refresh operation to be performed on the resistive memory cell array based on the refresh command, wherein the DC voltage is used as an operation voltage for the refresh operation.

2. The resistive memory apparatus of claim 1, wherein the control unit and the voltage generation unit are integrated with the memory unit.

3. The resistive memory apparatus of claim 1, wherein the voltage generation unit is integrated with the memory unit, and the control unit is separated from the memory unit.

4. The resistive memory apparatus of claim 1, wherein the voltage generation unit includes:
   a voltage multiplier suitable for generating the DC voltage by converting the RF signal input through an antenna, and boosting the DC voltage to a predetermined level; and
   a charger suitable for storing the boosted DC voltage, and providing the stored voltage as the operation voltage.

5. The resistive memory apparatus of claim 4, wherein the charger is integrated with the memory unit, and the control unit and the voltage multiplier are separated from the memory unit.

6. The resistive memory apparatus of claim 4, wherein the control unit and the charger are integrated with the memory unit, and the voltage multiplier is separated from the memory unit.

7. The resistive memory apparatus of claim 1, wherein the control unit includes:
   a controller suitable for performing a programming operation, a read operation, and the refresh operation on the resistive memory cell array;
   a signal processor suitable for decoding the RF signal to generate the refresh command, and providing the refresh command to the controller; and
   a clock generator suitable for receiving the refresh command, enabling/disabling the controller, and generating a refresh clock signal having a preset cycle.

8. The resistive memory apparatus of claim 1, further comprising a main power supply unit suitable for supplying a power to the memory unit.

9. An electronic system, comprising:
   a processor suitable for performing decoding on a command input from an external apparatus; and
   a resistive memory apparatus including a memory unit including a memory cell array accessed by the processor, a voltage generation unit suitable for receiving a radio frequency (RF) signal, and a control unit suitable for controlling a refresh operation on the memory cell array in response to a refresh command generated based on the RF signal, wherein the refresh command is provided as the RF signal.

10. The electronic system of claim 9, wherein the control unit and the voltage generation unit are integrated with the memory unit.

11. The electronic system of claim 9, wherein the voltage generation unit includes:
a voltage multiplier suitable for generating a direct current (DC) voltage by converting the RF signal input through an antenna, and boosting the DC voltage to a predetermined level; and
a charger suitable for storing the boosted DC voltage, and providing the stored voltage as an operation voltage.

12. The electronic system of claim 9, wherein the voltage generation unit receives the RF signal to generate an operation voltage for the refresh operation, and
the control unit applies the operation voltage to the memory cell array to perform the refresh voltage.

13. The electronic system of claim 9, wherein the control unit applies power provided from a main power supply unit included in the resistive memory apparatus to the memory cell array to perform the refresh operation.

14. The electronic system of claim 9, further comprising a communication module suitable for allowing the electronic system to be connected to a wireless or wired communication network.

15. An electronic system, comprising:
a resistive memory apparatus suitable for receiving a radio frequency (RF) signal, and performing a refresh operation on memory cells included the resistive memory apparatus based on the RF signal, wherein a refresh command is provided as the RF signal;
a memory controller suitable for controlling an operation of the memory apparatus; and
a card interface suitable for performing data exchange between a host and the memory controller.

16. The electronic system of claim 15, wherein the resistive memory apparatus comprises:
a memory unit including a resistive memory cell array;
a voltage generation unit suitable for receiving a radio frequency (RF) signal, and converting the RF signal into a direct current (DC) voltage; and
a control unit suitable for controlling a refresh operation to be performed on the resistive memory cell array, wherein the DC voltage is used as an operation voltage for the refresh operation.

17. The electronic system of claim 16, wherein the control unit and the voltage generation unit are integrated with the memory unit.

18. The electronic system of claim 16, wherein the voltage generation unit includes:
a voltage multiplier suitable for generating the DC voltage by converting the RF signal input through an antenna, and boosting the DC voltage to a predetermined level; and
a charger suitable for storing the boosted DC voltage, and providing the stored voltage as the operation voltage.

19. The electronic system of claim 16, further comprising a main power supply unit suitable for supplying a power to the memory unit.

20. An operating method of a resistive memory apparatus, the operating method comprising:
receiving a radio frequency (RF) signal; and
performing a refresh operation on memory cells included the resistive memory apparatus based on the RF signal, wherein the refresh command is provided as the RF signal.

21. The operating method of claim 20, further comprising:
converting the RF signal to a direct current (DC) voltage; and
boosting the DC voltage,
wherein the refresh operation is performed by using the boosted DC voltage as an operation voltage.

22. The operating method of claim 20, further comprising:
generating the refresh command by decoding the RF signal, wherein the refresh operation is performed in response to the refresh command.

* * * * *